United States Patent [19]

Hu et al.

[11] 4,346,457
[45] Aug. 24, 1982

[54] DOVETAIL PROPAGATION STRUCTURE FOR CONTIGUOUS DISK BUBBLE DEVICES

[75] Inventors: Hung L. Hu, Sunnyvale; Kochan Ju, San Jose, both of Calif.

[73] Assignee: International Business Machines Corporation, Armonk, N.Y.

[21] Appl. No.: 203,185

[22] Filed: Nov. 3, 1980

[51] Int. Cl.³ .............................................. G11C 19/08
[52] U.S. Cl. ........................................ 365/36; 365/15
[58] Field of Search ................... 365/13, 14, 15, 36, 365/39, 41

[56] References Cited

U.S. PATENT DOCUMENTS 4,247,912  1/1981  Cullum, Jr. et al. .................. 365/36
4,276,614  6/1981  Nelson et al. ......................... 365/36

OTHER PUBLICATIONS

Journal of Vacuum Science & Technology, vol. 15, No. 5, Sep./Oct. 1928, pp. 1674–1684.
Wolfe and Nelson, "Crystal Symmetry Effects in Ion-Implanted Propagation Patterns for Magnetic Bubbles-Roof-top Designs", IEEE Trans. Magnetics, MAG 15, 1323 (1978).
C. C. Shir, "Triangular Propagation Patterns for Contiguous-disk Magnetic Bubble Devices", IBM Technical Disclosure Bulletin, vol. 23, No. 5, Oct. 1980.
Y. S. Lin, G. S. Almasi, D. B. Dove, G. E. Keefe and C. C. Shir, "Orientation Dependence of Propagation Margin of 1-μm Bubble Contiguous-disk Devices", J. Appl. Phys. 50(3), Mar. 1979, pp. 2258–2260.

Primary Examiner—James W. Moffitt
Attorney, Agent, or Firm—Joseph E. Kieninger

[57] ABSTRACT

A propagation track for use in contiguous disk bubble devices consists of a plurality of spaced dovetail shaped elements which are connected at one end thereof by a track portion which faces in the direction of and is substantially perpendicular to the $(\bar{1},\bar{1},2)$ axis. The first, third and fifth sides of the dovetail structure are elongated and also face in the direction of and are substantially perpendicular to the $(\bar{1},\bar{1},2)$ axis. The remaining sides of the dovetail structure have different orientations, the second side facing in the direction of and being substantially perpendicular to the $(2,\bar{1},\bar{1})$ axis, and the fourth side facing in the direction of and being substantially perpendicular to the $(\bar{1},2,\bar{1})$ axis. The orientation of the two cusps formed by the first and second sides and the fourth and fifth sides is such that the lines bisecting and pointing toward the cusps are substantially parallel to the $(\bar{1},2,\bar{1})$ and $(2,\bar{1},\bar{1})$ axes, respectively.

8 Claims, 4 Drawing Figures

DOVETAIL PROPAGATION STRUCTURE FOR CONTIGUOUS DISK BUBBLE DEVICES

TECHNICAL FIELD

This invention relates to contiguous disk bubble devices and more particularly to a propagation track.

It is a primary object of this invention to provide an improved contiguous disk bubble device.

It is another object of this invention to provide a contiguous disk bubble propagation pattern.

It is still another object of this invention to provide a contiguous disk propagation pattern that provides a large propagation margin.

BACKGROUND ART

Contiguous disk patterns were discussed in a paper entitled "Crystal Symmetry Effects in Ion-implanted Propagation Patterns for Magnetic Bubbles—Roof-top Designs" by Wolfe and Nelson in IEEE Trans. Magnetics, MAG 15, 1323 (1979). FIG. 1A was disclosed in that paper. FIG. 1A describes a roof-top major loop design 10 having a triangular type track 12 of the elements 14, 18, 16 and 20. These elements are arranged so that their cusps are oriented such that one of the three crystal axes, in this case the ($\bar{1},\bar{1},2$) axis, is either $+30°$ or $-30°$ from the line bisecting the cusp angle.

Another contiguous bubble device propagation pattern by C. C. Shir, disclosed in IBM Technical Disclosure Bulletin Vol. 23 No. 5 page 2112, October 1980, is shown in FIG. 1B. The propagation tracks are parallel to one of the following three crystal directions: ($\bar{1},\bar{1},2$), ($\bar{1},2,\bar{1}$) and ($2,\bar{1},\bar{1}$). Every cusp is oriented such that one of the three crystal axes mentioned above is substantially bisecting the cusp angle.

BRIEF DESCRIPTION OF THE DRAWINGS

In the accompanying drawings forming a material part of this disclosure.

DISCLOSURE OF THE INVENTION

For a further understanding of the invention and of the objects and advantages thereof, reference will be had to the following description and accompanying drawings common to the appended claims in which the various novel features of the invention are more particularly set forth.

A propagation track for use in contiguous disk bubble devices consists of a plurality of spaced dovetail shaped elements which are conncted at one end thereof by a track portion which faces in the direction of and is substantially perpendicular to the ($\bar{1},\bar{1},2$) axis. The first, third and fifth sides of the dovetail structure are elongated and also face in the direction of and are substantially perpendicular to the ($\bar{1},\bar{1},2$) axis. The remaining sides of the dovetail structure have different orientations, the second side facing in the direction of and being substantially perpendicular to the ($2,\bar{1},\bar{1}$) axis, and the fourth side facing in the direction of and being substantially perpendicular to the ($\bar{1},2,\bar{1}$) axis. The orientation of the two cusps formed by the first and second sides and the fourth and fifth sides is such that the lines bisecting and pointing toward the cusps are substantially parallel to the ($\bar{1},2,\bar{1}$) and ($2,\bar{1},\bar{1}$) axes respectively.

BEST MODE FOR CARRYING OUT THE INVENTION

Figure 2:
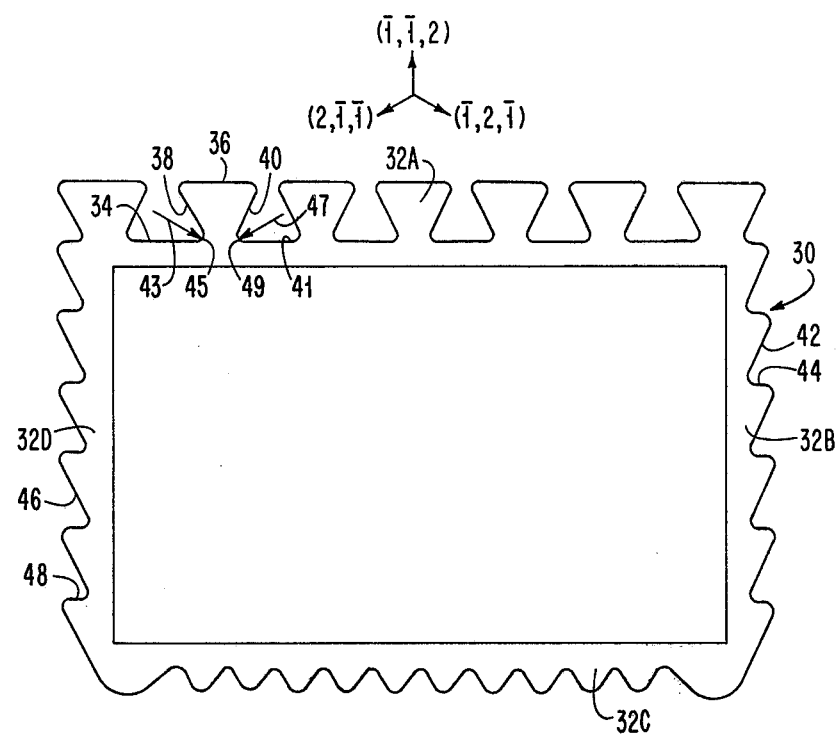
FIG. 2 is a top view of a contiguous disk propagation track in accordance with this invention.

In accordance with this invention, a major loop propagation struction 30 as shown in FIG. 2 includes propagation tracks 32A, B, C and D. The dovetail track portion 32A faces in the direction of and is substantially perpendicular to the ($\bar{1},\bar{1},2$) crystallographic axis of the bubble domain supporting material on which the track is positioned. All of the track portions 32A, B, C and D are unimplanted whereas the regions surrounding these portions are ion-implanted.

The section 32A has a portion 34 which faces in the direction of and is substantially perpendicular to the ($\bar{1},\bar{1},2$) axis. Another portion 36 of section 32A, is elongated and also faces in the direction of and is substantially perpendicular to the ($\bar{1},\bar{1},2$) axis. Portion 38 and portion 40 have different orientations. Portion 38 faces in the direction of and is substantially perpendicular to the ($2,\bar{1},\bar{1}$) axis and the portion 40 faces in the direction of and is substantially perpendicular to the ($\bar{1},2,\bar{1}$) axis. It is necessary that the portions 38 and 40 have different orientations from each other as well as from the orientation of portions 34 and 36. Portion 41 of section 32A is similar to 34 and faces in the direction of and is substantially perpendicular to the ($\bar{1},\bar{1},2$) axis.

Figure 1A:
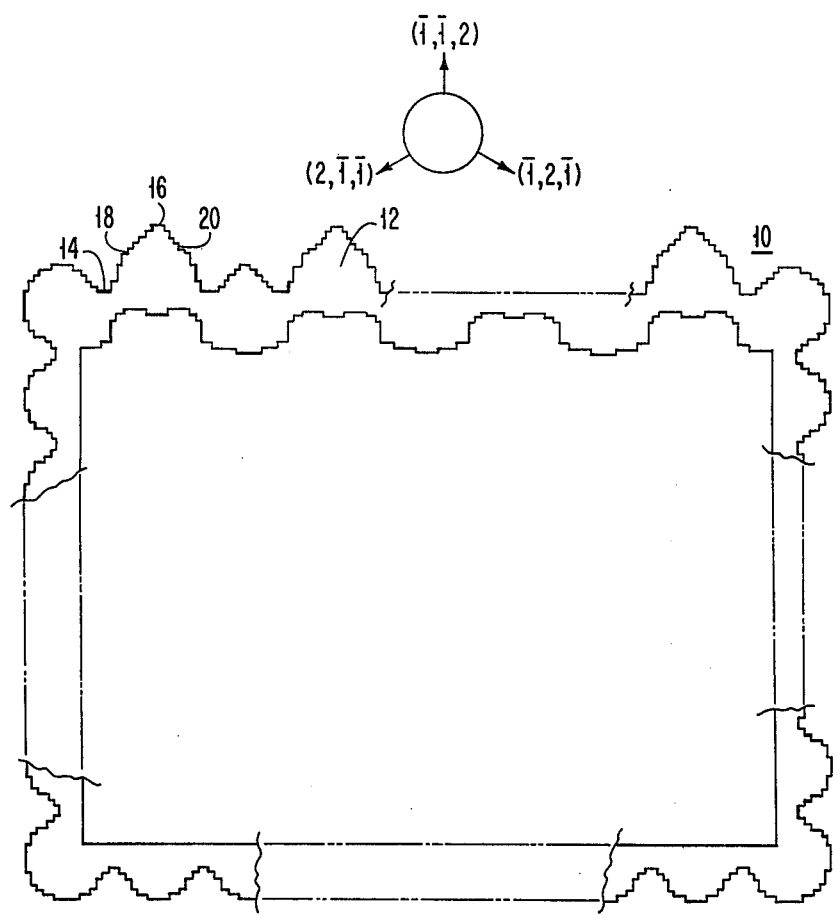
FIGS. 1A and 1B are top views of prior art contiguous disk bubble device patterns.
Figure 1B:
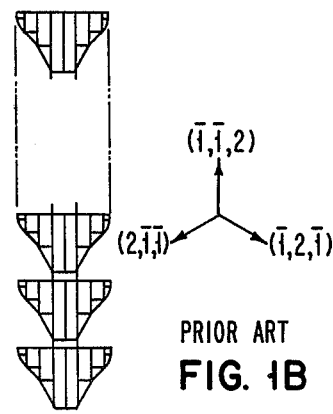

The orientation of the cusp 45 formed by portions 34 and 38 is such that the line 43 bisecting and pointing toward the cusp 45 is substantially parallel to the ($\bar{1},2,\bar{1}$) axis. The orientation of the cusp 49 formed by portions 40 and 41 is such that the line 47 bisecting and pointing toward the cusp 49 is substantially parallel to the ($2,\bar{1},\bar{1}$) axis. The bisecting lines 43 and 47 of cusps 45 and 49 respectively form an angle of $\pm 60°$ with the ($\bar{1},\bar{1},2$) crystal axis. Propagation along section 32A has a large propagation margin and is considerably larger than the prior art designs shown in FIGS. 1A and 1B.

The major loop structure 30 has sections 32B and 32D which are ratchet shaped. Section 32B consists of a repeating pattern in which portion 42 faces and is substantially perpendicular to the ($\bar{1},2,\bar{1}$) axis and portion 44 which faces and is substantially perpendicular to the ($\bar{1},\bar{1},2$) axis. Section 32D is similar in shape to section 32B. However, the portions 46 and 48 of section 32 have a different orientation than the portions 42 and 44 of section 32B. Portion 46 faces and is substantially perpendicular to the (2,1,1) direction whereas portion 48 faces and is substantially perpendicular to the (1,1,2) axis. Section 32C is similar to the prior art shown in FIG. 1A for the corresponding location in the major loop.

In another embodiment portions 32A, B, C, D may be arranged so that the propagation track is on the inside of major loop propagation structure 30 rather than on the outside as shown in FIG. 2. In that embodiment, portion 32A would be on the bottom of the structure rather than on the top and portion 32C would be on the top.

Figure 3:
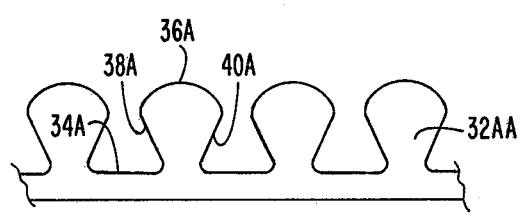
FIG. 3 is a top view of a preferred propagation track in accordance with this invention.

A preferred embodiment is shown in FIG. 3 where a portion of section 32AA is shown. In this embodiment portions 34A, 38A and 40A are substantially the same as shown in FIG. 2. Portion 36A is curved and has the shape of a "dovetail" whereas portion 36 in FIG. 2 is straight.

In other embodiments not shown, any of the track portions 34, 38, 36, 40 or 41 shown in FIG. 2 may be curved. In these embodiments it is also a requirement that the lines bisecting the cusps form alternating +60° and −60° angles with one of the three crystal axes previously mentioned.

The structure shown in FIG. 2 has been tested and has been found to have a propagation margin of 44 Oe (13%) from DC to 300 kHz operation. This margin is about 10 to 15 oersteds higher than the operating margin for the major loop shown in FIG. 1A.

While the invention has been described in terms of a major loop propagation track, this track can also be used in any propagation path, for example, in a folded minor loop.

While I have illustrated and described a preferred embodiment of my invention, it is understood that I do not limit myself to the precise construction herein disclosed, and the right is reserved to all changes and modifications coming within the scope of the invention, as described in the appended claims.

I claim:

1. A propagation track for use in contiguous disk bubble devices comprising
    a first track portion facing in the direction of and being substantially perpendicular to the $(\bar{1},\bar{1},2)$ axis,
    a second track portion facing in the direction of and being substantially perpendicular to one of the axes taken from the group consisting of $(2,\bar{1},\bar{1})$ and $(\bar{1},2,\bar{1})$, said second portion connected to said first portion,
    a third track portion facing in the direction of and being substantially perpendicular to the $(\bar{1},\bar{1},2)$ axis and connected to said second portion, and
    a fourth track portion connected to said third portion and facing in the direction of and being substantially perpendicular to the axis taken from the group consisting of $(2,\bar{1},\bar{1})$ and $(\bar{1},2,\bar{1})$ that is different from the axis selected for said second portion,
    a fifth track portion facing in the direction of and being substantially perpendicular to the $(\bar{1},\bar{1},2)$ axis, and connected to said fourth portion.

2. A propagation track as described in claim 1 wherein said second track faces in direction of $(2,\bar{1},\bar{1})$ axis.

3. A propagation track as described in claim 1 wherein said second track portion faces the $(\bar{1},2,\bar{1})$ axis.

4. A propagation track as described in claim 1 wherein said third track portion is straight.

5. A propagation track as described in claim 1 wherein said third track portion is curved.

6. A propagation track as described in claim 1 including a ratched-shaped track section connected to said fourth track portion.

7. A propagation track as described in claim 1 including ratchet-shaped track section connected to said second track portion.

8. A propagation track for use in contiguous disk bubble devices comprising
    a first track portion facing in the direction of and being substantially perpendicular to the $(\bar{1},\bar{1},2)$ axis,
    a second track portion facing in the direction of and being substantially perpendicular to one of the axes taken from the group consisting of $(2,\bar{1},\bar{1})$ and $(\bar{1},2,\bar{1})$, said second portion connected to said first portion to form a first cusp wherein a line bisecting and pointing toward said first cusp is substantially parallel to the other axis from this group,
    a third track portion facing in the direction of and being substantially perpendicular to the $(\bar{1},\bar{1},2)$ axis and connected to said second portion,
    a fourth track portion connected to said third portion and facing in the direction of and being substantially perpendicular to the axis taken from the group consisting of $(2,\bar{1},\bar{1})$ and $(\bar{1},2,\bar{1})$ that is different from the axis selected for said second portion, and
    a fifth track portion facing in the direction of and being substantially perpendicular to the $(\bar{1},\bar{1},2)$ axis and connected to said fourth portion to form a second cusp.

* * * * *